United States Patent
Verschuren et al.

(10) Patent No.: US 8,618,529 B2
(45) Date of Patent: Dec. 31, 2013

(54) DEVICE, METHOD AND SYSTEM FOR LIGHTING

(75) Inventors: Coen Adrianus Verschuren, Eindhoven (NL); Herbert Lifka, Eindhoven (NL); Margreet De Kok, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 411 days.

(21) Appl. No.: 12/738,308

(22) PCT Filed: Feb. 27, 2008

(86) PCT No.: PCT/IB2008/050696
§ 371 (c)(1),
(2), (4) Date: Apr. 16, 2010

(87) PCT Pub. No.: WO2009/053856
PCT Pub. Date: Apr. 30, 2009

(65) Prior Publication Data
US 2010/0230665 A1 Sep. 16, 2010

(30) Foreign Application Priority Data
Oct. 23, 2007 (EP) .................................... 07119048

(51) Int. Cl.
*H01L 51/52* (2006.01)
*H01L 51/56* (2006.01)
*B23K 26/42* (2006.01)

(52) U.S. Cl.
USPC .... 257/40; 438/99; 219/121.78; 257/E51.021

(58) Field of Classification Search
USPC .............. 257/40; 438/99; 219/121.85, 121.78
See application file for complete search history.

(56) References Cited

U.S. PATENT DOCUMENTS 5,851,903 A * 12/1998 Stamper .......................... 438/467
6,235,414 B1 * 5/2001 Epstein et al. ................. 428/690
(Continued)

FOREIGN PATENT DOCUMENTS

GB 2404775 A 2/2005
JP 2001167881 A 6/2001
(Continued)

OTHER PUBLICATIONS

Liu et al., "Photoactivated and patternable charge transport materials and their use in organic light-emitting devices." Applied Physics Letters 90 (23): 233503, 4 pages.*

(Continued)

*Primary Examiner* — Evan Pert
(74) *Attorney, Agent, or Firm* — David Zivan; Mark L. Beloborodov

(57) ABSTRACT

It is presented an organic LED device 101 with, when in use, a predetermined pattern on its light emitting parts. The organic LED device 101 comprises an anode 105, a cathode 103, and an organic light emitting layer 107. The organic light emitting layer 107 is configured to emit light, wherein the organic light emitting layer 107 comprises portion with reduced light emitting properties, the portions of the organic light emitting layer 107 having been irradiated by light with a wavelength in the absorption band of the organic light emitting layer 107, the light intensity being below an ablation threshold of the cathode layer 103, the anode layer 105 and the organic light emitting layer 107 of the organic LED device 101, reducing the light emitting properties of the irradiated portions of the organic light emitting layer 107. It is also presented a method for reducing the light emitting properties of the organic LED device 101.

21 Claims, 10 Drawing Sheets

(56) References Cited

U.S. PATENT DOCUMENTS

| | | |
|---|---|---|
| 2003/0222861 A1* | 12/2003 | Nishikawa et al. ........... 345/204 |
| 2004/0077250 A1 | 4/2004 | Miyadera et al. |
| 2004/0119028 A1 | 6/2004 | McCormick et al. |
| 2005/0236975 A1 | 10/2005 | Addington et al. |
| 2006/0066222 A1 | 3/2006 | Yoshida |
| 2011/0045244 A1* | 2/2011 | Mazur et al. .................. 428/141 |
| 2011/0207328 A1* | 8/2011 | Speakman .................... 438/694 |

FOREIGN PATENT DOCUMENTS

| | | |
|---|---|---|
| WO | 0207235 A1 | 1/2002 |
| WO | 2006087658 A1 | 8/2006 |

OTHER PUBLICATIONS

Shaw et al., "Organic Electronics: Introduction", IBM J. Res. & Dev. vol. 45, No. 1 Jan. 2001, pp. 1-9.*

* cited by examiner

DEVICE, METHOD AND SYSTEM FOR LIGHTING

TECHNICAL FIELD

The invention relates to the field of lighting, and more specifically to an organic LED device.

BACKGROUND OF THE INVENTION

An organic LED device typically comprises a cathode, an anode, an emissive layer and a conductive layer. These parts can be positioned on a substrate. The emissive and conductive layers are manufactured of organic material that can conduct an electric current. When a voltage is applied across the cathode and anode, electrons travel from the cathode towards the anode. Furthermore, holes are created in the conductive layer at the anode side. When electrons and holes recombine, photons are sent out through the organic LED device.

Organic LED devices are in many ways considered as the future in various lighting applications. They may, for instance, be used to create ambient lighting. Full 2-dimensional greyscale pictures can be made in a single organic LED device, while maintaining all intrinsic advantages of organic LED devices, for instance, being appealing, being a diffuse area light source and so on.

An example of a method for patterning organic LEDs is presented in the US 2004/0119028 document. The method comprises treating an encapsulated small molecule device with a laser beam having a wavelength in the infrared spectrum, decreasing the electroluminescence or showing a shift in the emitted colour in the areas exposed to the laser. Furthermore, US 2004/0119028 also teaches that by treating an encapsulated polymer device with the infrared laser beam, the electroluminescence is enhanced in the treated areas.

This method of US 2004/0119028 has some drawbacks, and can certainly be improved. Some of these issues will be addressed by the present invention.

SUMMARY OF THE INVENTION

In view of the above, an objective of the invention is to provide an improved organic LED device.

According to a first aspect of the present invention, there has been provided an organic LED device comprising an anode, a cathode, and an organic light emitting layer, the organic light emitting layer being configured to emit light, wherein at least part of the organic light emitting layer has reduced light emitting properties, the at least part of the organic light emitting layer having been irradiated with light with a wavelength in an absorption band of the organic light emitting layer, the light intensity being below an ablation threshold of the anode layer, the cathode layer and the organic light emitting layer of the organic LED device, reducing the light emitting properties of the irradiated at least part of the organic light emitting layer.

Organic LED devices can be used for ambient lighting, and patterning organic LED devices is therefore desirable. Polymer and oligomer materials are easily accessible, potentially cheap and easy to use in organic LED devices. Therefore it is of great importance to be able to find patterning methods for these materials. According to the present invention, in use, the irradiated portions have reduced light emitting properties. The irradiation may be performed during the manufacturing, or even when the organic LED device has been encapsulated. Furthermore, there are no visible patterns remaining in the off-state, because there is no visible damage on the organic LED device. The ablation threshold is defined as the highest intensity of light without ablation of the organic light emitting layer, the cathode layer and the anode layer.

The organic light emitting layer may be a polymer or a stack of polymers.

The organic light emitting layer may be an oligomer or a stack of oligomer layers.

The organic light emitting layer may be an oligomer combined with polymers or a stack of oligomers combined with polymers.

The organic LED device may further comprise a substrate on which or above which a mask may be temporarily mounted. In this case the irradiated light may be locally blocked by the mask, for instance, a photolithography mask, allowing the transmitted light to locally change the light emitting properties of the organic LED device. An advantage is that it is very flexible to pattern the organic LED device after production. It is easy to change pattern on individual organic LED devices by simply changing the mask. A further advantage is that the mask does not have to have the same size as the substrate size of the organic LED device production line. Masks with the size of one or a few organic LED devices are sufficient.

The mask may be a photolithography mask.

The anode layer may be arranged to permit irradiating light to pass through, before reaching the organic light emitting layer. When the organic LED device has been encapsulated, it is possible to irradiate the organic light emitting layer through the anode layer. The intensity of the light should therefore also be below an ablation threshold of the anode layer.

The cathode layer may be arranged to permit irradiating light to pass through, before reaching the organic light emitting layer.

The organic light emitting layer may be arranged to alter light emission properties when irradiated with light with a wavelength in the visible light spectrum.

The organic LED device may be encapsulated with an encapsulating body.

According to a second aspect of the present invention, it is provided a method for reducing light emitting properties, by means of light, of an organic light emitting layer of an organic LED device, wherein the organic LED device further comprises a cathode layer and an anode layer, the light having a wavelength in an absorption band of the organic light emitting layer, the method comprising the step of: irradiating desired portions of the organic light emitting layer with the light, the light intensity being below an ablation threshold of any of the anode layer, the cathode layer and organic light emitting layer, reducing light emitting properties of the irradiated at least part of the organic light emitting layer.

The method may further comprise the step, prior to the step of irradiating, of enclosing the organic LED device with an encapsulating body.

In the step of irradiating the organic light emitting layer, the light may pass through the anode layer before reaching the organic light emitting layer.

In the step of irradiating the organic light emitting layer, the light may pass through the cathode layer before reaching the organic light emitting layer.

The method according to the second aspect of the present invention, wherein the step of irradiating the organic light emitting layer may involve irradiating with a laser beam.

Laser light has many special properties, such as being coherent and collimated. It is thus possible to create very exact and advanced patterns using laser light, e.g. by rapidly scanning the area to be patterned with a focused laser beam, which is synchronously modulated in intensity (e.g. on/off) according to the pattern to be recorded.

The method may further comprise the step, prior to the step of irradiating the organic light emitting layer, of coating the organic LED device with a mask.

The irradiating the organic light emitting layer may involve irradiating with a light in the visible light spectrum.

The irradiating the organic light emitting layer may involve irradiating different portions of the organic light emitting layer with light of different intensity. Different light intensity on different portions changes the light emitting properties in different ways of the organic light emitting layer, enabling greyscale images to be shown on the organic LED device. Thus, the reduction of electroluminescence is different in the different portions.

According to a third aspect of the present invention, it is provided a method of providing a customer-specific organic LED device, wherein a pattern on the organic LED device is generated on-demand by way of receiving a pattern layout from a customer and in response thereto patterning the organic LED device according to the pattern layout by reducing the light emitting properties of the organic LED device by irradiating an organic light emitting layer of the organic LED device with laser light, without ablation of the organic light emitting layer or any other layer of the organic LED device.

Patterning by means of photolithography masks may be quite expensive, and may therefore not be suitable for customer-specific designs in small quantities. From starting a new design to implementing the new photolithography mask, may take several weeks. The present invention according to the third aspect enables for quick reactions and action to customer demand. It is furthermore a low cost alternative to the more expensive photolithography masks.

The receiving may involve receiving the pattern layout via a web interface. A customer can thus via the web interface indicate which pattern layout he wants on an organic LED device. In this way, a much larger audience can be addressed with similar or less investment in infrastructure, such as housing and advertising.

The receiving may involve receiving the pattern layout from an on-site store storage medium. As mentioned in connection with the first aspect of the present invention, a patterned organic LED device according to the first aspect and the method according to the second aspect, allows for patterning after the organic LED device has been encapsulated. Therefore, an on-site store may store unpatterned encapsulated organic LED devices. A customer may thus, at location of the on-site store, select a pattern to be implemented on the organic LED device. The customer would then be able to receive the patterned organic LED device at the on-site store. In order for the on-site store to be able to deliver patterned organic LED devices, it would only need a modest investment in a laser patterning device and associated equipment.

The pattern layout may be selected from a group consisting of a customer selected existing pattern layout, a customer created pattern layout, a semi-finished pattern layout and a customer uploaded pattern layout. A customer thus has a large scope to select a pattern layout desired by the customer.

The selection may be based on user input.

The customer selected existing pattern may be selected from a data base accessible to the customer.

The pattern layout may be combined with computer generated text. This enables for the customer to further personalize the end product, i.e. the patterned organic LED device.

The patterning may further comprise programming a laser patterning device to execute laser patterning instructions, wherein the laser patterning instructions are based on the received pattern layout.

The organic LED device may further comprise a cathode layer and an anode layer, the laser light having a wavelength in an absorption band of the organic light emitting layer, comprising irradiating desired portions of the organic light emitting layer with the laser light, the laser light intensity being below an ablation threshold of any of the anode layer, the cathode layer and the organic light emitting layer, reducing light emitting properties of the irradiated at least part of the organic light emitting layer, wherein the desired portions are associated with the pattern layout.

According to a fourth aspect of the present invention, it is provided a method of providing an organic LED-device to a customer, wherein a pattern on the organic LED device is generated on-demand by way of receiving a pattern layout from the customer and in response thereto programming a laser patterning device, based on the received pattern layout, to execute laser patterning instructions on the organic LED device.

The execution of the patterning instructions may involve reducing the light emitting properties of the organic LED device by irradiating an organic light emitting layer of the organic LED device with laser light, without ablation of the organic light emitting layer or any other layer of the organic LED device. Due to the laser light being below an ablation threshold, there are no visible patterns remaining in the off-state of the organic LED device, because there is no visible damage on the organic LED device.

The receiving may involve receiving the pattern layout via a web interface.

The receiving may involve receiving the pattern layout from an on-site store storage medium.

The pattern layout may be selected from a group consisting of a customer selected existing pattern layout, a customer created pattern layout, a semi-finished pattern layout and a customer uploaded pattern layout.

According to a fifth aspect of the present invention, it is provided a system for providing a customer-specific organic LED device, comprising: a pattern receiver for receiving a pattern layout; a laser patterning device for producing a pattern, according to the pattern layout, in the organic LED device; and an organic LED device wherein the receiver receives the pattern layout and provides the pattern layout to the laser patterning device, reducing the light emitting properties of the organic LED device by irradiating an organic light emitting layer of the organic LED device with laser light, without ablation of the organic light emitting layer or any other layer of the organic LED device.

The pattern receiver is incorporated into the laser patterning device. Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

Other objectives, features and advantages of the present invention will appear from the following detailed disclosure, from the attached dependent claims as well as from the drawings.

BRIEF DESCRIPTION OF THE DRAWINGS

The above, as well as additional objects, features and advantages of the present invention, will be better understood through the following illustrative and non-limiting detailed description of embodiments of the present invention, with reference to the appended drawings, where the same reference numerals will be used for similar elements, wherein.

DETAILED DESCRIPTION OF EMBODIMENTS

Figure 1:
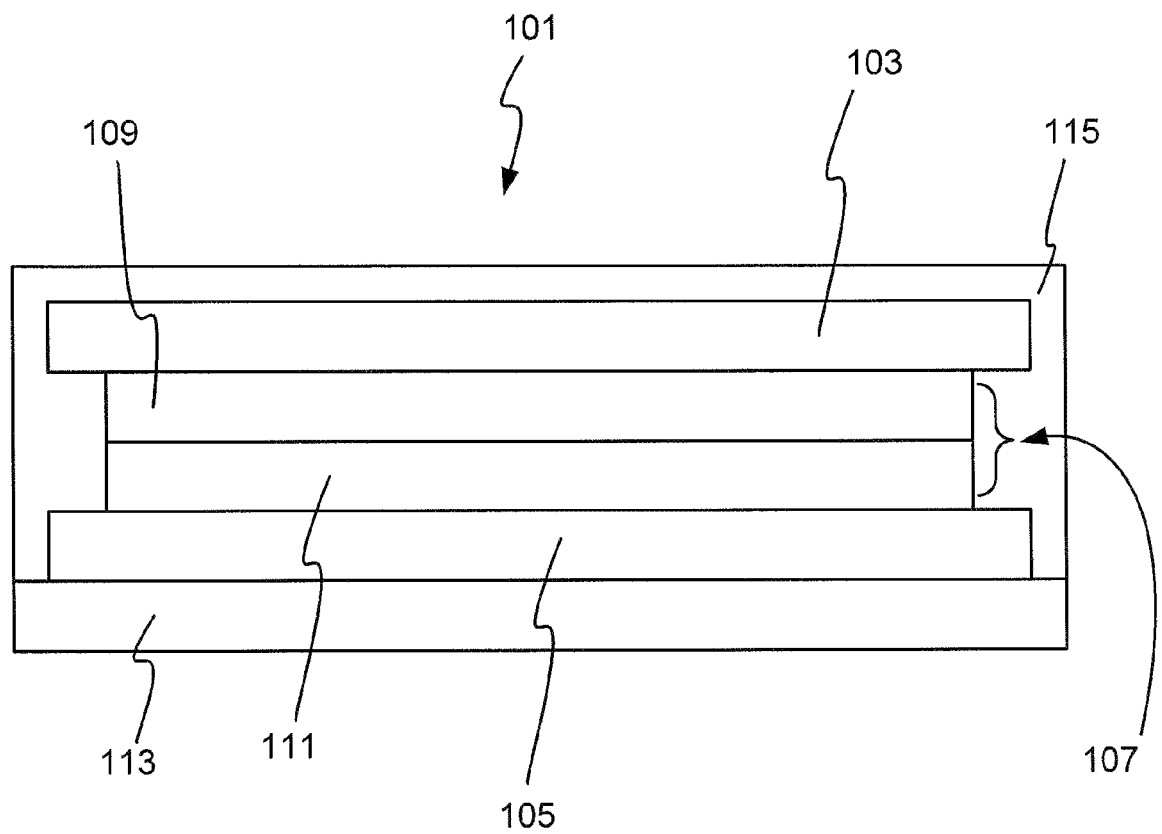
FIG. 1 shows a side view of an encapsulated organic LED device.

FIG. 1 shows a side view of an encapsulated organic LED device according to an embodiment of the present invention. The organic LED device 101 comprises a cathode 103 and an anode 105. The anode 105 may for instance comprise Indium tin-oxide (ITO), but can be comprised of any suitable material. A voltage can be applied over the cathode 103 and the anode 105, resulting in a current flow through an emissive layer 109 and a conductive layer 111, the emissive layer 109 and the conductive layer 111 being manufactured of an organic material such as a polymer or an oligomer. The organic LED device further comprises a substrate 113 on which the cathode 103, the anode 105, the emissive layer 109 and conductive layer 111 may be placed. The emissive layer 109 and the conductive layer 111 forms an organic light emitting layer 107. In order for the organic LED device 101 to function properly and for protection from contamination from, for instance, dust and small particles, the organic LED device 101 can be encapsulated with an encapsulating body 115 such as an encapsulating lid. When a voltage is applied, electrons and holes recombine in the organic light emitting layer 107 and light is sent out through the organic LED device 101. The light can, for instance, be sent out through the anode 103, in which case the anode 105 is transparent. The cathode 103 can also be transparent, as can the substrate 113, which, for example can be made of glass. The substrate 113 can be placed on either electrode layer side, i.e. the anode 105 layer side or the cathode 103 layer side.

Figure 2:
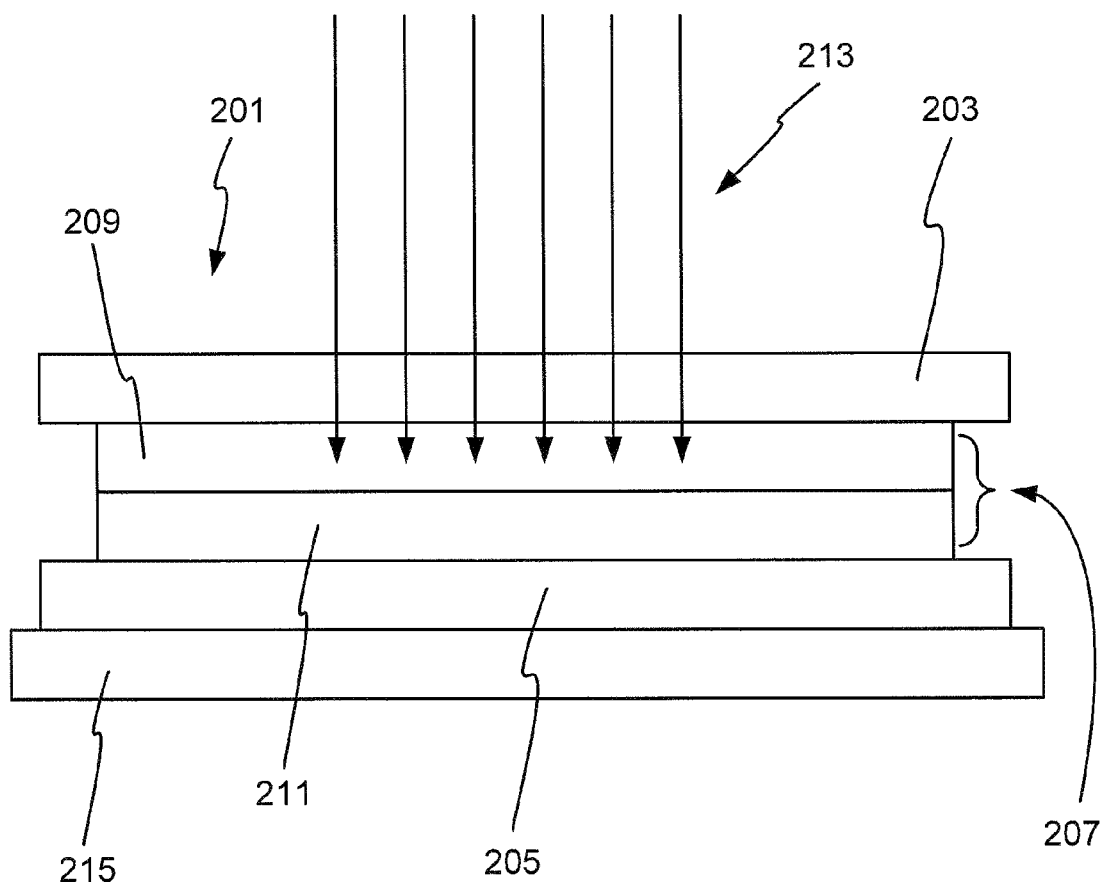
FIG. 2 shows a side view of an organic LED device being irradiated.

FIG. 2 shows a side view of an organic LED device being irradiated according to an embodiment of the present invention. Incoming light 213 irradiates the organic LED device 201 to affect light emitting properties of the organic light emitting layer 207 in desired areas, the light passing through the cathode 203, the emissive layer 209 and the conductive layer 211. The light can further pass through the anode 205 and the substrate 215. In one embodiment, the light 213 first passes through the anode 205. Furthermore, in one embodiment, the encapsulating body 115 of FIG. 1 can be mounted prior to the process of irradiating with light 213 being performed. In one embodiment, prior to mounting layers external to the organic light emitting layer 207, the light 213 is irradiated directly on the organic light emitting layer 207. The light can in this case first be directed so as to pass the emissive layer 209 first and then further continue into the conductive layer 211, or vice versa. The intensity of the light 213 should be below the ablation threshold of any one of the cathode 203, anode 205, emissive 209 and conductive 211 layers. Visible damage due to ablation can thereby be avoided. Furthermore, the light 213 intensity should be below a threshold such that the substrate 215 will not absorb so much energy from the light so that the energy absorbed leads to thermal damage of the organic LED device 201. The light 213 should have a wavelength in the absorption band of the organic light emitting layer 207, in one embodiment avoiding wavelengths below 400 nm. The photo-induced process in the organic light emitting layer 207 causes a strong reduction of the original light emission in the irradiated areas of the organic light emitting layer 207, allowing a pattern to be visible when the organic LED device 201 is its on-state.

In one embodiment, the light 213 is laser light. The organic LED device 201 can, for instance, be a standard super-yellow device of bottom emission type, on a 0.5 mm soda-lime glass substrate. The light 213 can come from a frequency doubled Nd:YAG laser (532 nm wavelength).

In one embodiment, the organic LED device 201 can have a blue-emitting polymer. The light 213 can have a wavelength of 405 nm. In this case, a low-price solid state diode laser as used in Blue-ray disc products can be used.

In one embodiment, the laser light 213 has different intensity in different portions of the organic light emitting layer 207 to be treated, resulting in the organic LED device 201 having different electroluminescence characteristics in the different portions of the organic light emitting layer 207 irradiated with the laser light 213. This in turn, can produce greyscale images.

Figure 3:
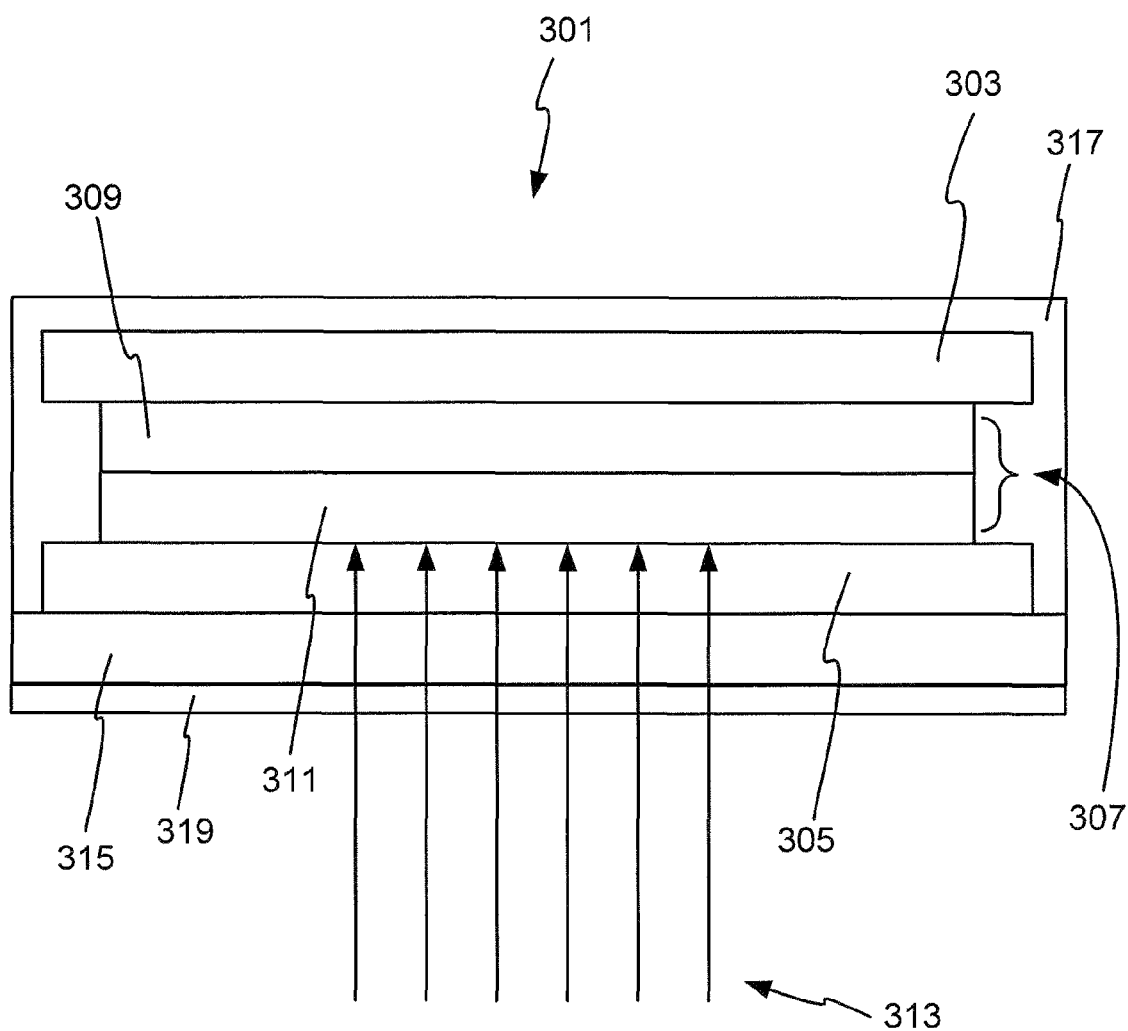
FIG. 3 shows a side view of an organic LED device being irradiated.

FIG. 3 shows a side view of an organic LED device being irradiated according to an embodiment of the present invention. The organic LED device 301 comprises a cathode 303, an anode 305, an organic light emitting layer 307 comprising an emissive layer 309 and a conductive layer 311, the organic LED device 301 further comprising a substrate 315 and an encapsulating body 317. The numerals with the same last two digits corresponds to the same numerals of FIG. 2, i.e. 307 in FIG. 3 correspond to 207 in FIG. 2, for instance. Additionally, a mask 319, such as a photolithography mask, a shadow mask, or a foil, is placed on the external side of the substrate 315 (not necessarily in contact). The mask 319 can also be placed on the external side of the encapsulating body 317.

In one embodiment, the mask 319 is irradiated with light 313 with a wavelength in the ultra violet (UV) spectrum. The limited intensity of the light 313, in contrast to irradiation with laser light, leads to a longer exposure time.

Figure 4A:
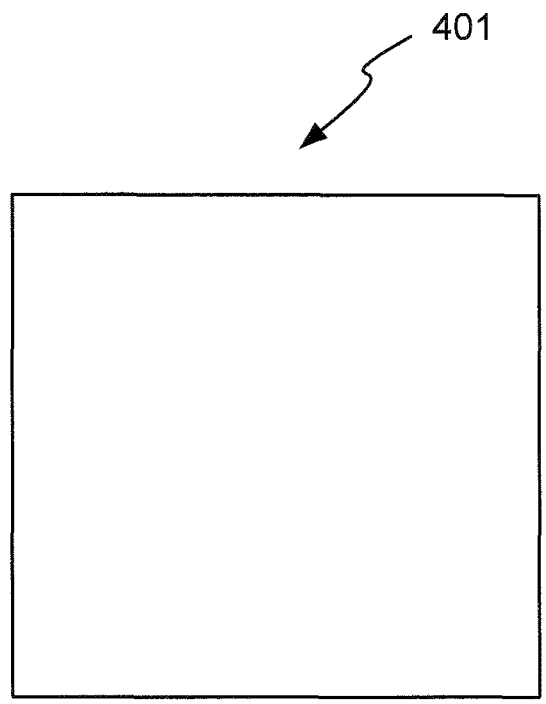
FIG. 4a-b shows a top view of an the organic LED.
Figure 4B:
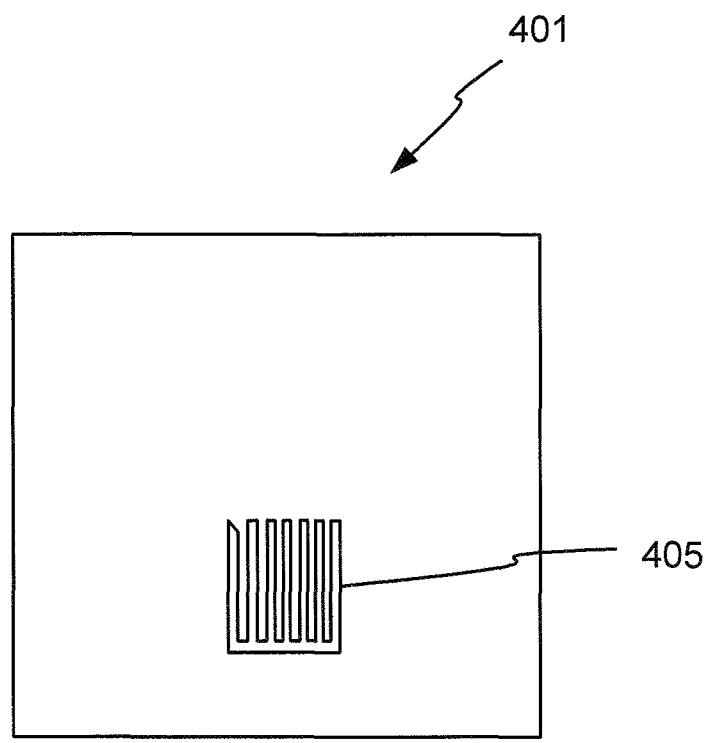

FIG. 4a-b shows a top view of an organic LED device according to an embodiment of the present invention. FIG. 4a shows a top view of the organic LED device 401 in an off-state, according to an embodiment described above in FIG. 2, where the organic LED device 401 has been irradiated with laser light. FIG. 4a shows that there are no visible signs of the laser treated areas when the organic LED device 401 is in the off-state.

FIG. 4b shows an example of an organic LED device 401 in the on-state, in which the patterned area 405 has been irradiated with laser light. This area 405 has reduced electroluminescence characteristics due to the laser irradiation, resulting in the visibly patterned area 405.

Figure 5:
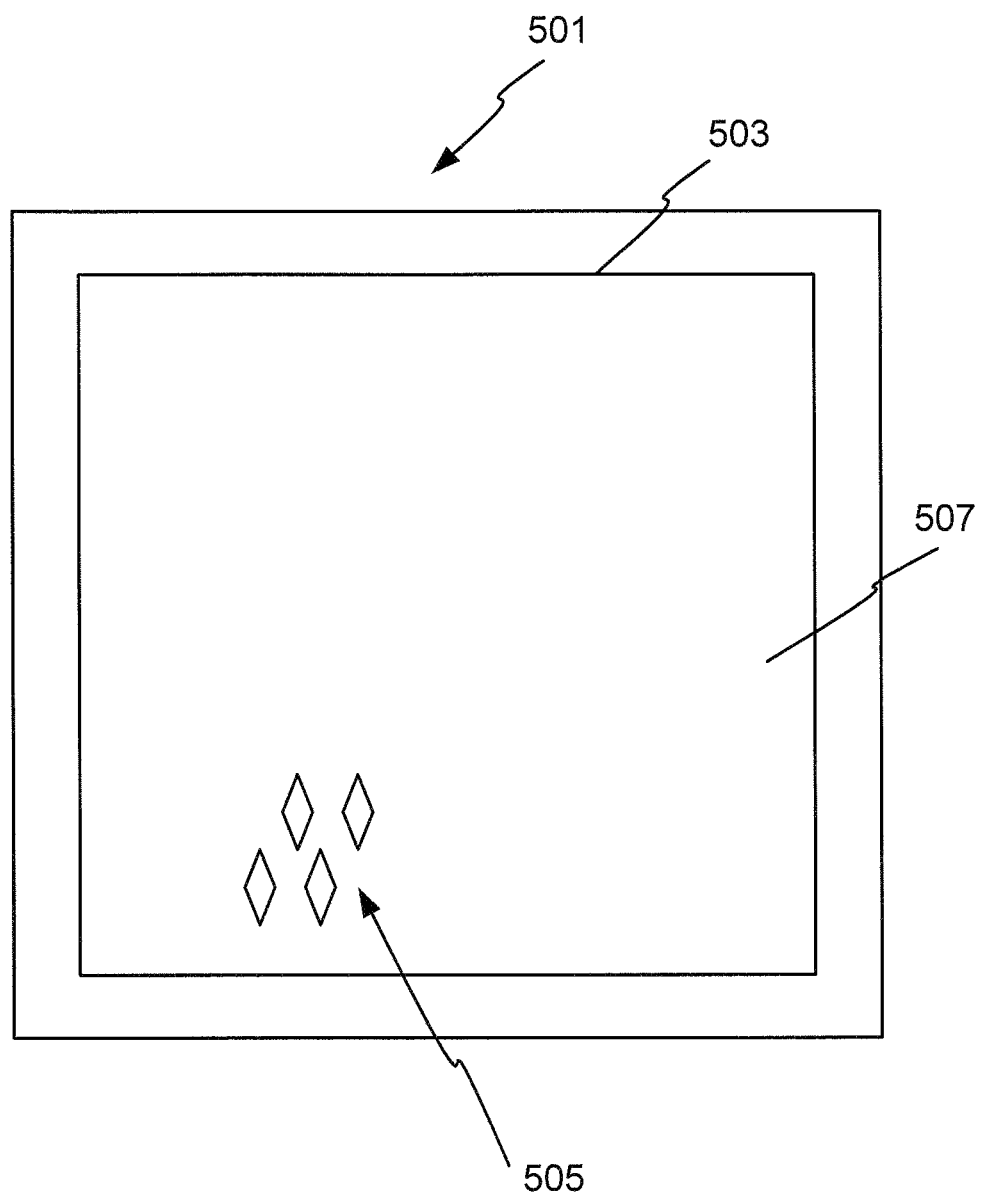
FIG. 5 shows a top view of an organic LED device.

FIG. 5 shows a top view of an organic LED device according to an embodiment of the present invention. The organic LED device 501 has been temporarily coated with a mask 503 after production, according to the description of FIG. 3. In one embodiment, the mask 503 need not be the same size as the substrate 315 size of FIG. 3. Here, for example, the area of the mask 507 is smaller than the organic LED device 501. In this example, in the area 507 covered by the mask 503, four parallelogram-shaped figures 505 are shown, the figures 505 emitting light with unchanged intensity, wherein the rest of the area 507 has reduced light emitting properties. During use, the figures 505 can thus be visualized. Thus, the mask 503 is patterned prior to being placed onto the organic LED device 501. When the organic LED device 501 is in the off-state, no pattern 505 or mask 503 can be seen, as described in the description of FIG. 4a.

Figure 6:
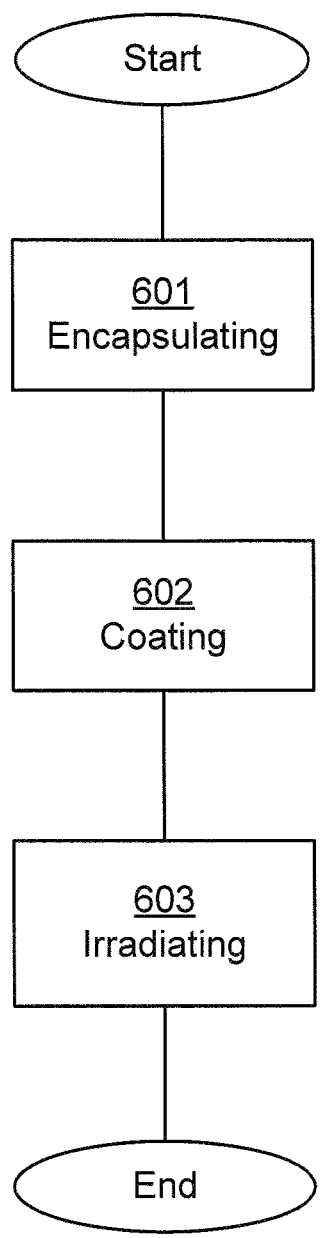
FIG. 6 is a flowchart illustrating a method for reducing the electroluminescence of an organic LED device.

FIG. 6 shows a method for reducing the electroluminescence of an organic LED device according to the present invention.

In an encapsulating with an encapsulating body step 601, the organic LED device 101, 201, 301, 401, 501 is encapsulated, to protect the organic LED device 101, 201, 301, 401, 501 from contamination.

In a coating step 602, the organic LED device 101, 201, 301, 401, 501 is coated with a mask 319, 503. This step is only performed if the organic LED device 101, 201, 301, 401, 501 is to be irradiated in the irradiating step 602 with a light source without laser beam characteristics.

In the irradiating step 603, the organic LED device 101, 201, 301, 401, 501 is irradiated with light 213, 313. The light 213, 313 passes through at least one, or a plurality of an anode 103, 203, 303, a cathode 105, 205, 305 and a substrate 113, 215, 315 layer. The light 213, 313 irradiates an emissive layer 109, 209, 309 and a conductive layer 111, 211, 311 of an organic layer 107, 207, 307. The light 213, 313 can be laser light. Different areas of the organic light emitting layer 107, 207, 307 of the organic LED device 101, 201, 301, 401, 501 can be irradiated with laser light with varying intensity. In one embodiment, the irradiating step 603 is performed prior to the step of encapsulating with an encapsulating body step 601. In one embodiment, the irradiating step 603 further comprises the light passing through the anode 103, 203, 303 layer before reaching the organic light emitting layer 107, 207, 307.

In one embodiment, the irradiating step 603 further comprises the light passing through the cathode 105, 205, 305 layer before reaching the organic light emitting layer 107, 207, 307

These steps change the light emitting characteristics of the organic LED device 101, 201, 301, 401, 501, resulting in a patterned images of the organic LED device 101, 201, 301, 401, 501, and even full greyscale photography.

Figure 7:
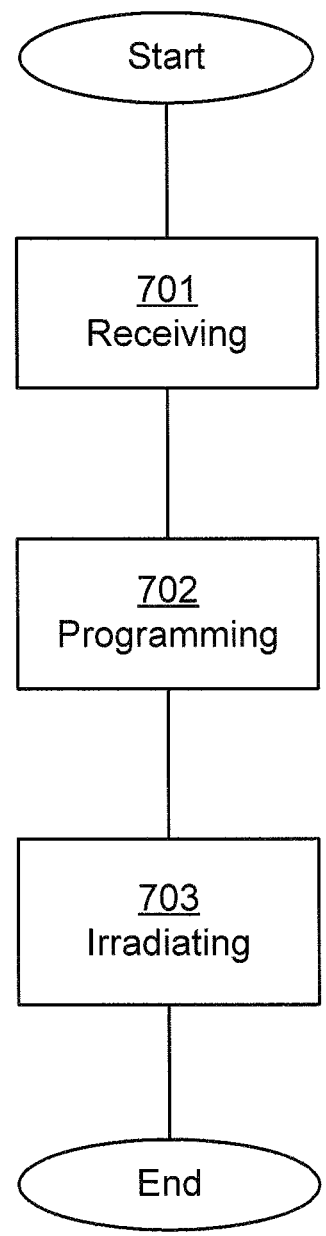
FIG. 7 is a flowchart illustrating a method of providing a customer-specific organic LED device.

FIG. 7 is a flowchart illustrating a method of providing a customer-specific organic LED device.

In a receiving a customer-specific pattern layout step 701 a pattern layout can be received from a customer. The receiving can involve receiving the pattern layout via a communications network, such as the Internet or an intranet. The pattern layout can be any kind of pattern suitable to fit an organic LED device, for instance a pattern created by a customer, a semi-finished pattern, a customer selected existing pattern or an uploaded pattern. For instance, a customer who wants a patterned organic LED device, can visit an organic LED device patterning establishment, which may be a third-party establishment, such as a shop, with respect to the organic LED device manufacturer. At the third party establishment, the customer can select a pattern layout from a variety of already existing pattern layouts or any other type of pattern layout as mentioned above.

In a programming a laser patterning device step 702, the laser patterning device receives program code with instructions to carry out the patterning of the organic device, according to the specifications of the customer. In one embodiment, the laser patterning device carries out the conversion of the pattern layout to program code instructions.

In a reducing the light emitting properties step 703, the light emitting properties of an organic LED device can be reduced by irradiating the light emitting layer of the organic LED device with laser light as described with reference to FIGS. 2-6.

A customer can send the pattern layout via a web interface. The web interface can for instance be connected to the Internet or an intranet. The customer can select from an existing assortment of pattern layouts, upload a new pattern layout, create a new pattern layout by means of a computer program configured to create new pattern layouts, or the customer can finish a semi-finished pattern according to the liking of the customer. The pattern layout can be combined with computer generated text. The computer generated text can have various fonts, size and appearance, such as bold, italic outline or other types of appearances.

Figure 8:
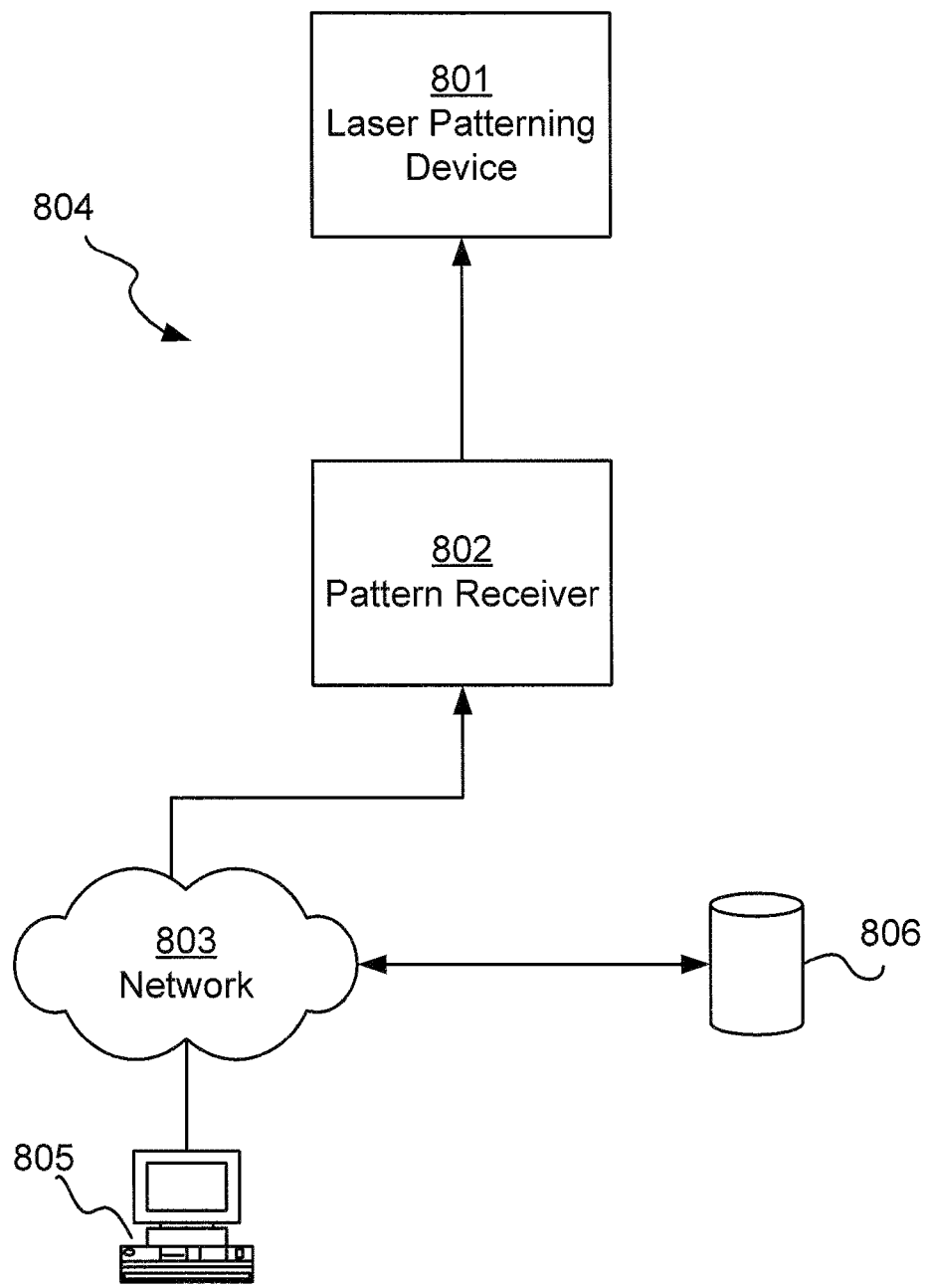
FIG. 8 shows a block diagram of a system for providing a customer-specific organic LED.

FIG. 8 shows a block diagram of a system for providing a customer-specific organic LED device. The system 804 comprises a laser patterning device 801, a pattern receiver 802, a network 803, a personal computer 805, and a data base 806. A customer using the personal computer 805 can via a web interface browse among pattern layouts, and select a desired pattern layout. Pattern layout can for instance be stored in a database 806 accessible over the network 803 via the web interface. In one embodiment, the customer can upload a pattern layout to the personal computer 805. The user can for instance upload the pattern layout by means of a scanner or by connecting an external storage medium, such as a portable hard drive or a USB memory stick. The user can then upload the pattern layout via a web interface over the network 803, such as the Internet, to the pattern receiver 802. The web interface can provide a preview of the created or chosen pattern layout. Alternatively, the preview can comprise previewing a patterned organic LED device with the customer selected pattern, wherein the customer can be able to specify the physical appearance of the organic LED device, such as the external color and shape of the organic LED device. After selecting the desired pattern, specified the number of samples, i.e. organic LED devices to be ordered, the method of payment and related issues, the design can automatically be transferred to the laser patterning device 801. The pattern receiver 802 can generate an, for the laser patterning device 801, executable program code, which when carried out by the laser patterning device 801 results in the patterning of an organic LED device according to the desired pattern. The laser patterning device 801 can comprise a processor for executing the program code. Such a processor can for instance be a CPU.

Figure 9:
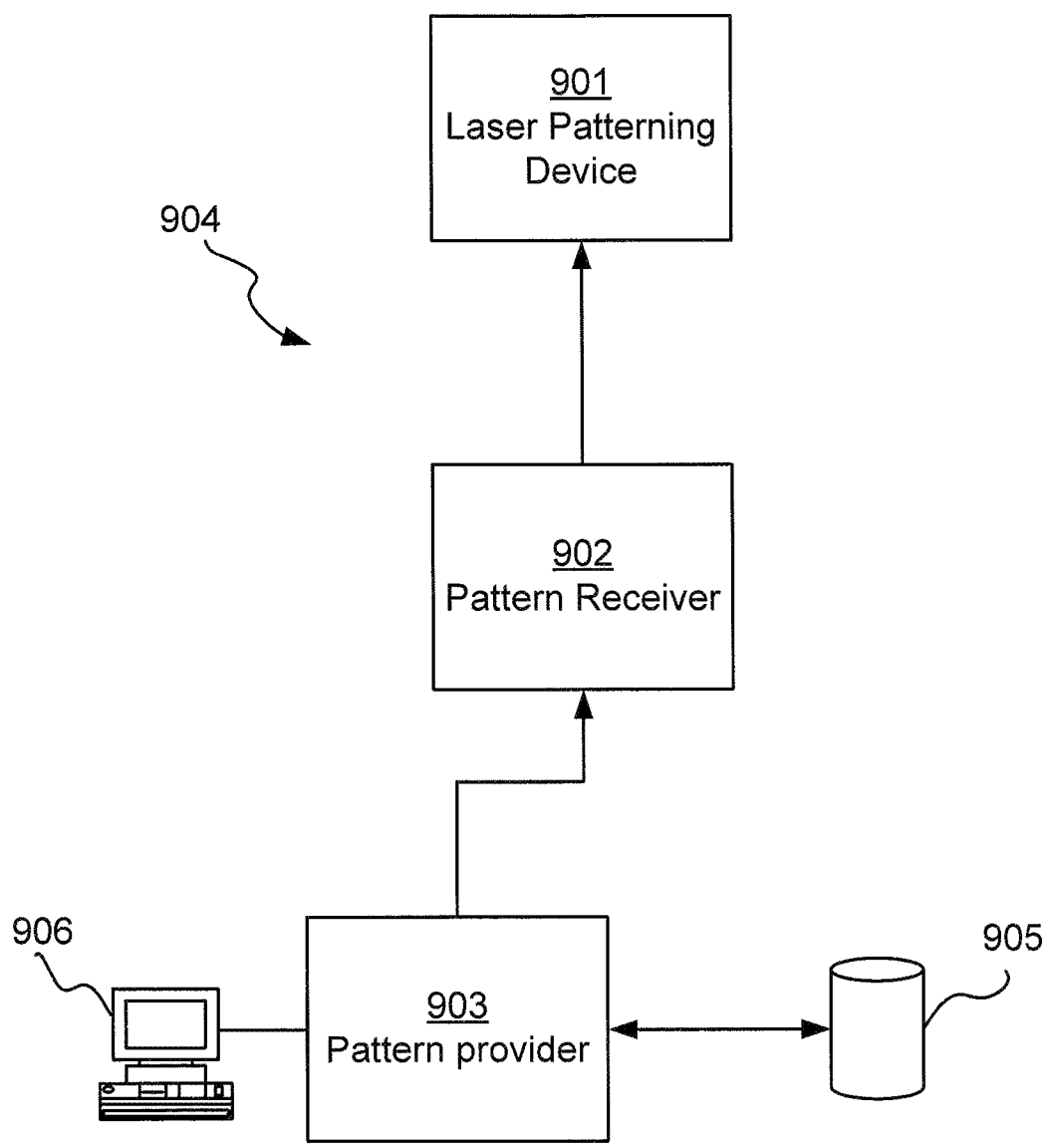
FIG. 9 shows a block diagram of a system for providing a customer-specific organic LED device.

FIG. 9 shows a block diagram of a system for providing a customer-specific organic LED device. The system 904 comprises a laser patterning device 901, a pattern receiver 902, a pattern provider 903, a data base 905 and a personal computer 906. The pattern provider 903 can provide pattern layouts to customers. For instance, a pattern provider 903 can be a third-party establishment, such as a store. Alternatively, the pattern provider 903 can be a company that manufactures unpatterned organic LED devices, wherein the patterning can, for instance, be performed at the site of an organic LED device factory. The database 905 can be connected to the pattern provider 903, wherein the database 905 contains a plurality of pattern layouts selectable by the customer. The personal computer 906 can be connected to the database 905, via the pattern provider 903, to facilitate for the customer to select between various pattern layouts. Alternatively, the customer can create his own pattern at the pattern provider 903, wherein the created pattern can be stored in the data base 905 for future access for the same customer or alternatively, for any customer. Alternatively, the data base is accessible to a store chain associated with the third-party establishment, wherein a customer visiting any store within the store chain can get access to a complete customer-updated library of pattern layouts. The customer can select, in a menu of a computer program, at the personal computer 906 to allow public access to a customer created pattern. In one embodiment, the customer can bring a pattern, either stored on a digital storage medium or a non-digitalized pattern such as a photo, to the pattern provider 903, wherein the brought pattern can be arranged to be patterned on an organic LED device, by for instance, in case of the photo, scanning the photo into the computer 906. The pattern provider 903 can send the selected pattern to a pattern receiver 902. The pattern receiver 902 can in turn send the received pattern to a laser-patterning device 901. In one embodiment, the laser-patterning device 901 can be in-house, that is, at the location of the pattern provider 903. In this case, the customer can quickly get the desired patterned organic LED device in possession. The laser-patterning device 901 carries out program instructions associated with the pattern, in order to transfer the pattern to the organic LED device.

With reference to FIGS. 8 and 9, in one embodiment, the third-party establishment can furthermore provide additional packaging of the patterned organic LED device such as driver/power supply, a nice looking frame and similar features related to providing a complete-package customer-specific organic LED device.

Figure 10A:
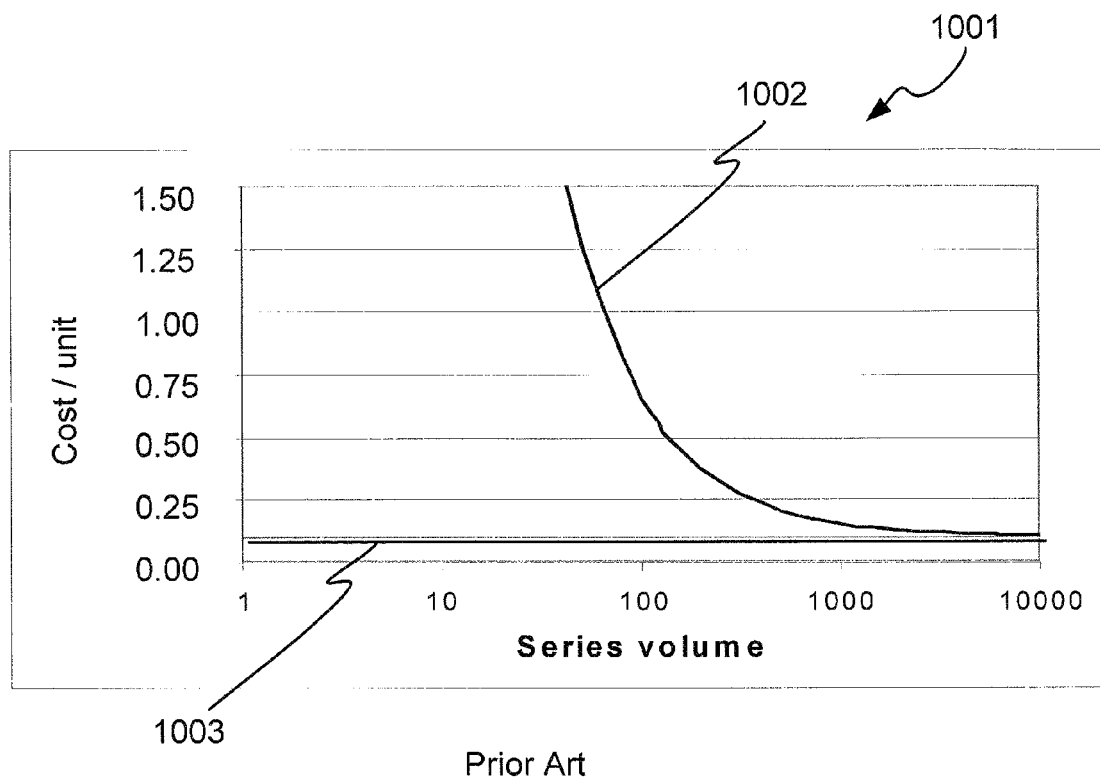
FIG. 10a-b shows diagrams of the cost per unit in serial.
Figure 10B:
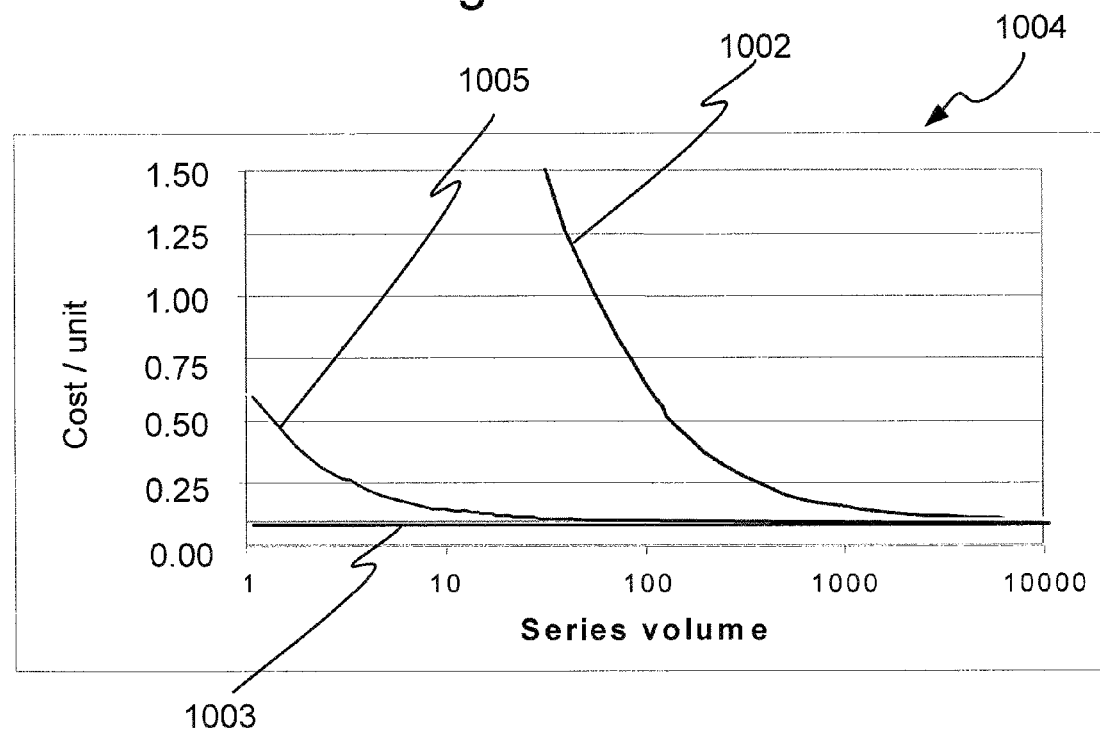

FIG. 10*a-b* shows diagrams of the cost per unit in serial production.

In FIG. 10*a*, a diagram 1001 shows an example of the cost/unit for organic LED devices with respect to series volume in prior art, where the cost/unit is normalized. An organic LED device of the standard 100 cm$^2$ size costs 0.10 monetary units. This is shown by the graph 1003. As can be seen by 1003, the cost is constant. The graph 1002 shows the price/unit of a patterned organic LED device according to existing patterning methods, such as methods involving photolithography masks. In case a new pattern is desired, a new, expensive photolithography mask must be produced. A new photolithography mask can, including a mask changing operation, cost 55 monetary units. Therefore, a large quantity of patterned organic LED devices with the same pattern needs to be produced in order to overcome the investment of the new photolithography mask, and thus become attractive to a customer. As can be seen by the graph 1002, close to one thousand units needs to be produced in order to achieve an inexpensive patterned organic LED device.

In FIG. 10*b*, a diagram 1004 shows an example of the cost/unit for organic LED devices with respect to series volume according to the present invention. The graph 1002 corresponds to the graph 1002 of FIG. 10*a* and shows the price/unit of a patterned organic LED device according to existing patterning methods, such as using photolithography masks. The graph 1003 describes the price/unit of a standard, unpatterned organic LED device, corresponding to graph 1003 of FIG. 10*a*. The graph 1005 describes the cost/unit of a patterned organic LED device according to the methods and systems described above. The starting cost is heavily reduced in comparison with prior art. The pattern layout cost for each new series lies within the range of 0-0.50 monetary units.

The invention claimed is:

1. An organic LED device comprising:
   a substrate;
   an anode;
   a cathode;
   an organic light emitting layer; and
   an encapsulating body encapsulating the anode, the cathode and the organic light emitting layer, the organic light emitting layer being configured to emit light, wherein at least part of the organic light emitting layer has reduced light emitting properties, the at least part of the organic light emitting layer having been irradiated through the encapsulating body with laser light with a wavelength in an absorption band of the organic light emitting layer, the laser light intensity being below an ablation threshold of the anode, the cathode and the organic light emitting layer of the organic LED device, reducing the light emitting properties of the irradiated at least part of the organic light emitting layer.

2. The organic LED device according to claim 1, wherein the organic light emitting layer is a polymer or a stack of polymers.

3. The organic LED device according to claim 1, wherein the organic light emitting layer is an oligomer or a stack of oligomers.

4. The organic LED device according to claim 1, wherein the organic light emitting layer is an oligomer combined with polymers or a stack of oligomers combined with polymers.

5. The organic LED device according to claim 1, wherein the anode is arranged to permit irradiating light to pass through, before reaching the organic light emitting layer.

6. The organic LED device according to claim 1, wherein the cathode is arranged to permit irradiating light to pass through, before reaching the organic light emitting layer.

7. The organic LED device according to claim 1, wherein the organic light emitting layer is arranged to alter light emission properties when irradiated with light with a wavelength in the visible light spectrum.

8. A method for reducing light emitting properties, by means of light, of an organic light emitting layer of an organic LED device, wherein the organic LED device further comprises a cathode layer, an anode layer, and an encapsulating body encapsulating the anode layer, the cathode layer and the organic light emitting layer, the light having a wavelength in an absorption band of the organic light emitting layer, the method comprising the step of:
   irradiating desired portions of the organic light emitting layer through the encapsulating body with the light, the light intensity being below an ablation threshold of the organic light emitting layer, reducing light emitting properties of the irradiated portions of the organic light emitting layer.

9. The method according to claim 8, wherein in the step of irradiating the desired portions of the organic light emitting layer, the light passes through the anode layer before reaching the organic light emitting layer.

10. The method according to claim 8, wherein in the step of irradiating the desired portions of the organic light emitting layer, the light passes through the cathode layer before reaching the organic light emitting layer.

11. A method of providing a customer-specific organic LED device, said device including an organic light emitting layer and an encapsulating body that encapsulates the organic light emitting layer, wherein a pattern on the organic LED device is generated on-demand by way of receiving a pattern layout from a customer and in response thereto patterning the organic LED device according to the pattern layout by reducing the light emitting properties of the organic LED device by irradiating desired portions of an organic light emitting layer of the organic LED device through the encapsulating body with laser light, the laser light intensity being below an ablation threshold of the organic light emitting layer of the organic LED device.

12. The method according to claim 11, wherein the receiving involves receiving the pattern layout via a web interface.

13. The method according to claim 11, wherein the receiving involves receiving the pattern layout from an on-site store storage medium.

14. The method according to claim 11, wherein the pattern layout is selected from a group consisting of a customer selected existing pattern layout, a customer created pattern layout, a semi-finished pattern layout and a customer uploaded pattern layout.

15. The method according to claim 14, wherein the selection is based on user input.

16. The method according to claim 14, wherein the customer selected existing pattern is selected from a database accessible to the customer.

17. The method according to claim 11, wherein the patterning further comprises programming a laser patterning device to execute laser patterning instructions, wherein the laser patterning instructions are based on the received pattern layout.

18. The method according to claim 11, wherein the organic LED device further comprises a cathode layer and an anode layer, the laser light having a wavelength in an absorption band of the organic light emitting layer, and the laser light intensity being below an ablation threshold of any of the anode layer and the cathode layer, wherein the irradiating reduces light emitting properties of the irradiated desired portions of the organic light emitting layer, and wherein the desired portions are associated with the pattern layout.

19. A method of providing an organic LED device to a customer, wherein a pattern on the organic LED device is generated on-demand by way of receiving a pattern layout from the customer and in response thereto programming a laser-patterning device, based on the received pattern layout, to execute laser-patterning instructions on the organic LED device, wherein the execution of the laser-patterning instructions involves reducing the light emitting properties of the organic LED device by irradiating at least a portion of an organic light emitting layer of the organic LED device through an encapsulating body that encapsulates the organic light emitting layer with laser light, the laser light intensity being below an ablation threshold of the organic light emitting layer of the organic LED device.

20. A system for providing a customer-specific organic LED device, comprising:
 a pattern receiver for receiving a pattern layout;
 a laser patterning device for producing a pattern, according to the pattern layout, in the organic LED device; and
 an organic LED device
 wherein the receiver receives the pattern layout and provides the pattern layout to the laser patterning device, reducing the light emitting properties of the organic LED device by irradiating at least a portion of an organic light emitting layer of the organic LED device through an encapsulating body that encapsulates the organic light emitting layer with laser light, the laser light intensity being below an ablation threshold of the organic light emitting layer of the organic LED device.

21. The system according to claim 20, wherein the pattern receiver is incorporated into the laser-patterning device.

* * * * *